(12) United States Patent
Young

(10) Patent No.: US 10,958,003 B2
(45) Date of Patent: Mar. 23, 2021

(54) INTERLEAVED CARD/RISER CONNECTION ASSEMBLY FOR COMPACT CARD INTEGRATION

(71) Applicant: Intel Corporation, Santa Clara, CA (US)

(72) Inventor: Gene F. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/537,309

(22) Filed: Aug. 9, 2019

(65) Prior Publication Data

US 2021/0044043 A1 Feb. 11, 2021

(51) Int. Cl.
*H01R 12/73* (2011.01)
*H05K 7/14* (2006.01)
*H01R 12/70* (2011.01)
*H01R 13/73* (2006.01)

(52) U.S. Cl.
CPC ....... *H01R 12/735* (2013.01); *H01R 12/7076* (2013.01); *H01R 13/73* (2013.01); *H05K 7/1439* (2013.01); *H05K 7/1487* (2013.01)

(58) Field of Classification Search
CPC . H01R 12/3785; H01R 12/7076; H01R 13/73
USPC ........................................................ 439/65
See application file for complete search history.

(56) References Cited

U.S. PATENT DOCUMENTS

| | | | | |
|---|---|---|---|---|
| 6,533,587 B1* | 3/2003 | Potter | ............. | G06F 1/184 257/E23.099 |
| 6,572,384 B1* | 6/2003 | Marchevsky | ......... | G06F 13/409 439/43 |
| 6,805,560 B1* | 10/2004 | Budny | ............. | H01R 12/52 439/65 |
| 7,075,797 B1* | 7/2006 | Leonard | ............. | G06F 1/184 361/785 |
| 7,280,373 B2* | 10/2007 | Aizawa | ............. | G06F 1/184 361/792 |
| 7,440,293 B2* | 10/2008 | Hood, III | ............. | G06F 1/184 361/807 |
| 7,778,020 B2* | 8/2010 | Flynn | ............. | G06F 1/183 312/223.1 |
| 7,848,115 B2* | 12/2010 | Casto | ............. | G06F 1/18 361/788 |
| 7,996,602 B1* | 8/2011 | Warnes | ............. | G11C 5/04 711/105 |
| 8,045,340 B2* | 10/2011 | Heinrichs | ............. | G06F 1/185 361/807 |
| 8,102,671 B2* | 1/2012 | Goldstein | ............. | H05K 7/1431 361/761 |
| 9,496,633 B1* | 11/2016 | Huang | ............. | G06F 1/185 |
| 9,642,280 B2* | 5/2017 | Chen | ............. | H05K 7/1489 |
| 10,353,442 B2* | 7/2019 | Searby | ............. | G06F 1/185 |
| 10,437,762 B2* | 10/2019 | Beckett | ............. | G06F 9/4403 |
| 10,445,277 B1* | 10/2019 | Lan | ............. | G06F 3/0601 |
| 10,466,923 B2* | 11/2019 | Ping | ............. | G06F 13/4022 |

(Continued)

*Primary Examiner* — Alexander Gilman
(74) *Attorney, Agent, or Firm* — Compass IP Law PC

(57) ABSTRACT

An apparatus is described. The apparatus includes a first riser card connected to a first card. The apparatus also includes a second riser card connected to a second card, wherein, the first card's connection to the first riser card and the second card's connection to the second riser card pass through a vertical plane runs parallel to respective surfaces of the first and second riser cards.

18 Claims, 12 Drawing Sheets

(56) References Cited

U.S. PATENT DOCUMENTS

| | | | | |
|---|---|---|---|---|
| 10,483,673 | B2* | 11/2019 | Alcorn | H01R 12/7047 |
| 10,624,226 | B1* | 4/2020 | Alvarado | H05K 5/0256 |
| 2002/0182899 | A1* | 12/2002 | Debord | H05K 7/1444 |
| | | | | 439/65 |
| 2006/0238991 | A1* | 10/2006 | Drako | G06F 1/185 |
| | | | | 361/796 |
| 2008/0268673 | A1* | 10/2008 | Le | G06F 1/185 |
| | | | | 439/79 |
| 2011/0086520 | A1* | 4/2011 | Mills | H01R 12/7011 |
| | | | | 439/64 |
| 2012/0033370 | A1* | 2/2012 | Reinke | G06F 1/185 |
| | | | | 361/679.4 |
| 2013/0038999 | A1* | 2/2013 | Tian | H05K 1/117 |
| | | | | 361/679.41 |
| 2013/0151745 | A1* | 6/2013 | Yin | G06F 1/185 |
| | | | | 710/301 |
| 2013/0155637 | A1* | 6/2013 | Yin | G06F 1/185 |
| | | | | 361/791 |
| 2015/0062797 | A1* | 3/2015 | Yin | G06F 1/185 |
| | | | | 361/679.32 |
| 2015/0092788 | A1* | 4/2015 | Kennedy | H05K 7/1422 |
| | | | | 370/419 |
| 2015/0347345 | A1* | 12/2015 | Hellriegel | G06F 13/409 |
| | | | | 710/301 |
| 2016/0043484 | A1* | 2/2016 | Brodsky | H01R 11/01 |
| | | | | 439/65 |

* cited by examiner

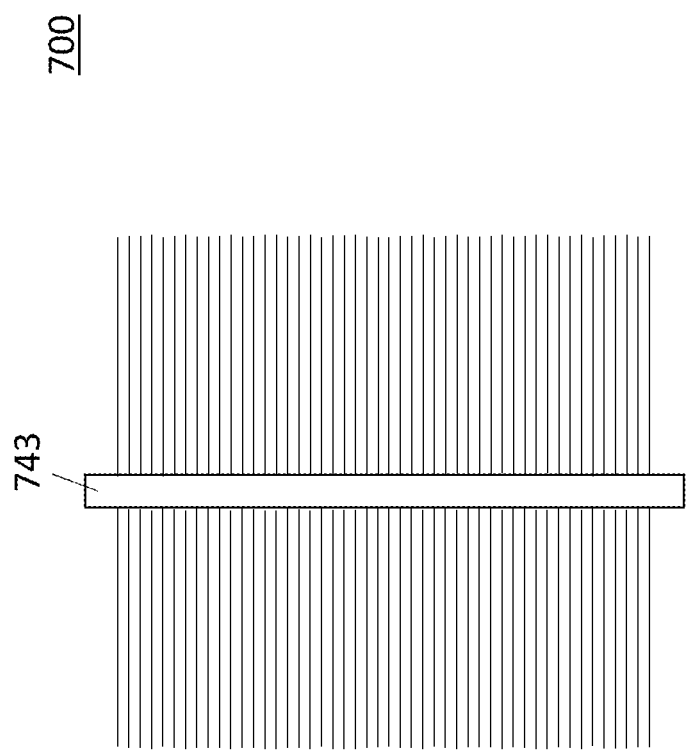

US 10,958,003 B2

INTERLEAVED CARD/RISER CONNECTION ASSEMBLY FOR COMPACT CARD INTEGRATION

FIELD OF INVENTION

The field of invention pertains generally to the electronic arts and, more specifically, to an interleaved card/riser connection assembly for compact card integration

BACKGROUND

Computing and networking system designers are continually trying to integrate as much functionality as they can into small physical spaces. In the case of data centers, the design challenge is particularly important because tighter integration of function into smaller spaces results in smaller overall data center floor space consumption.

FIGURES

A better understanding of the present invention can be obtained from the following detailed description in conjunction with the following drawings, in which.

Figure 7B:
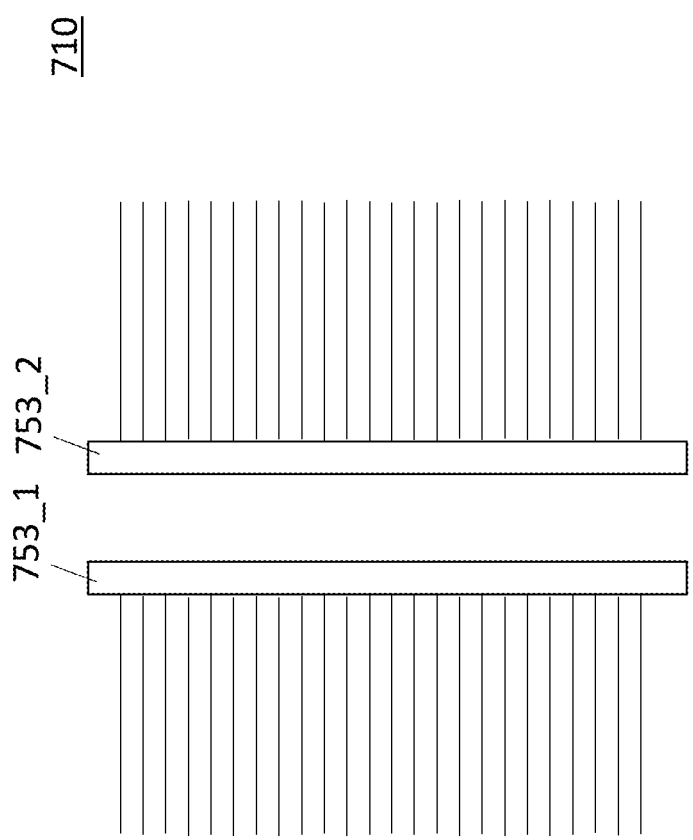
Figure 8:
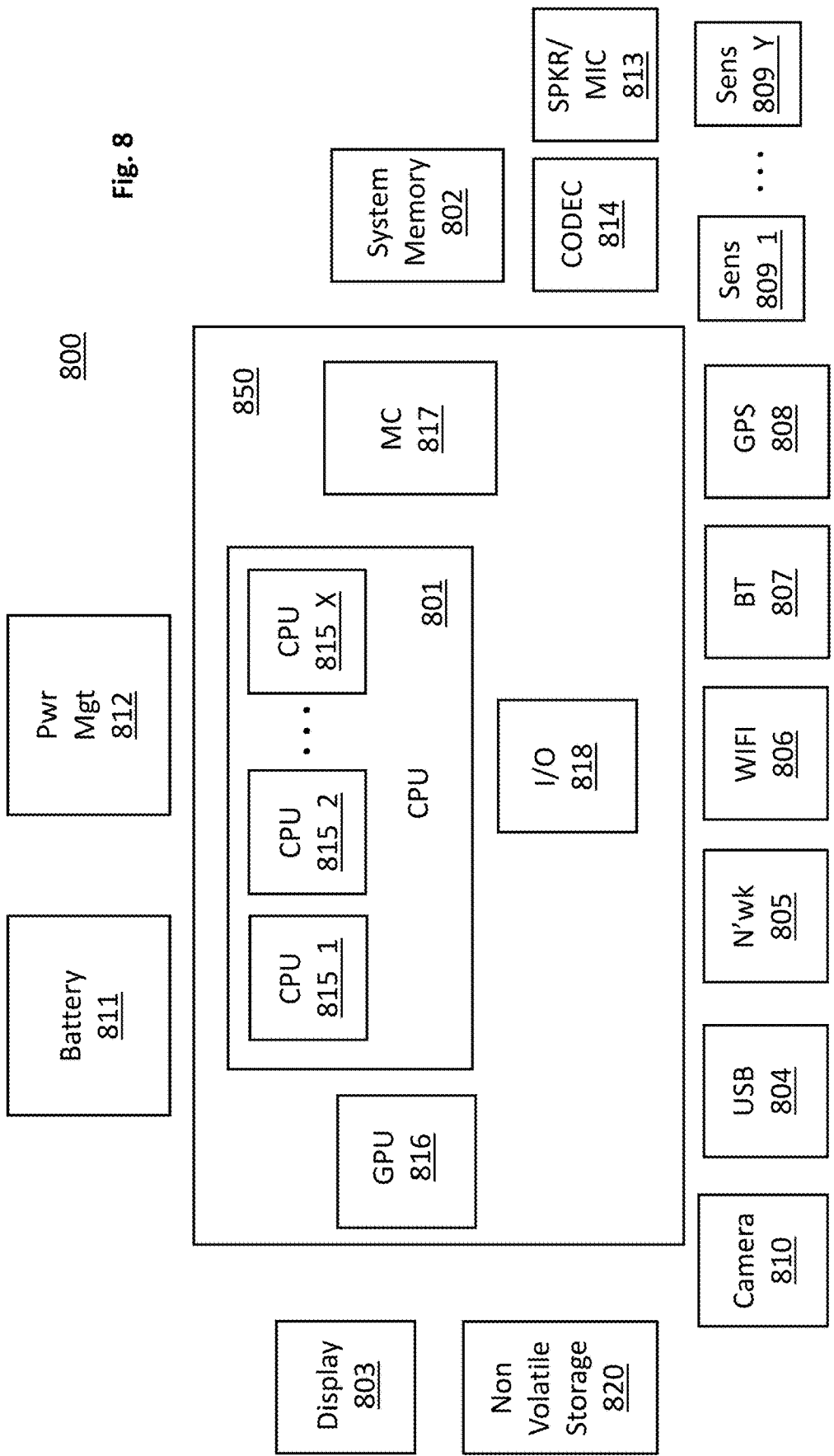
Figure 9:
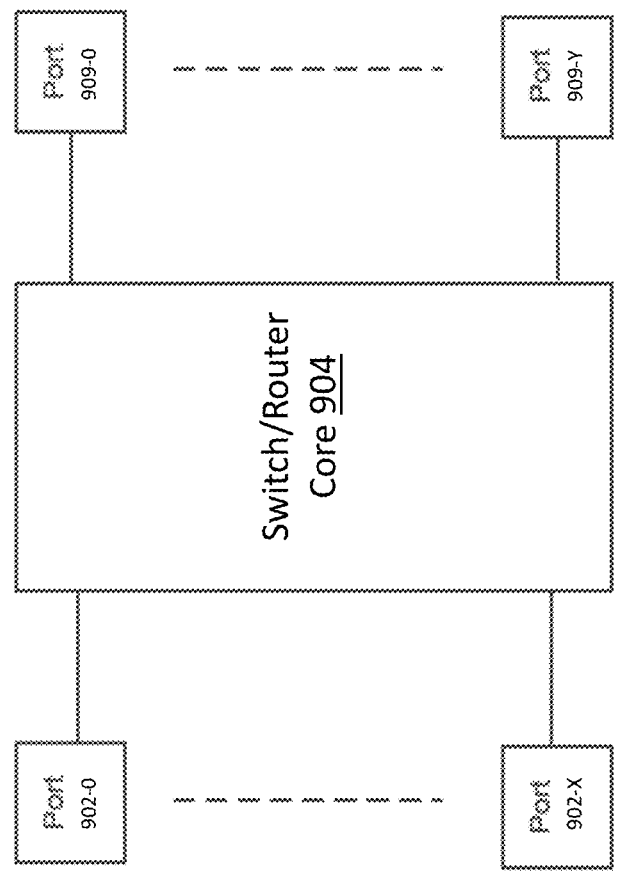
Figure 10:
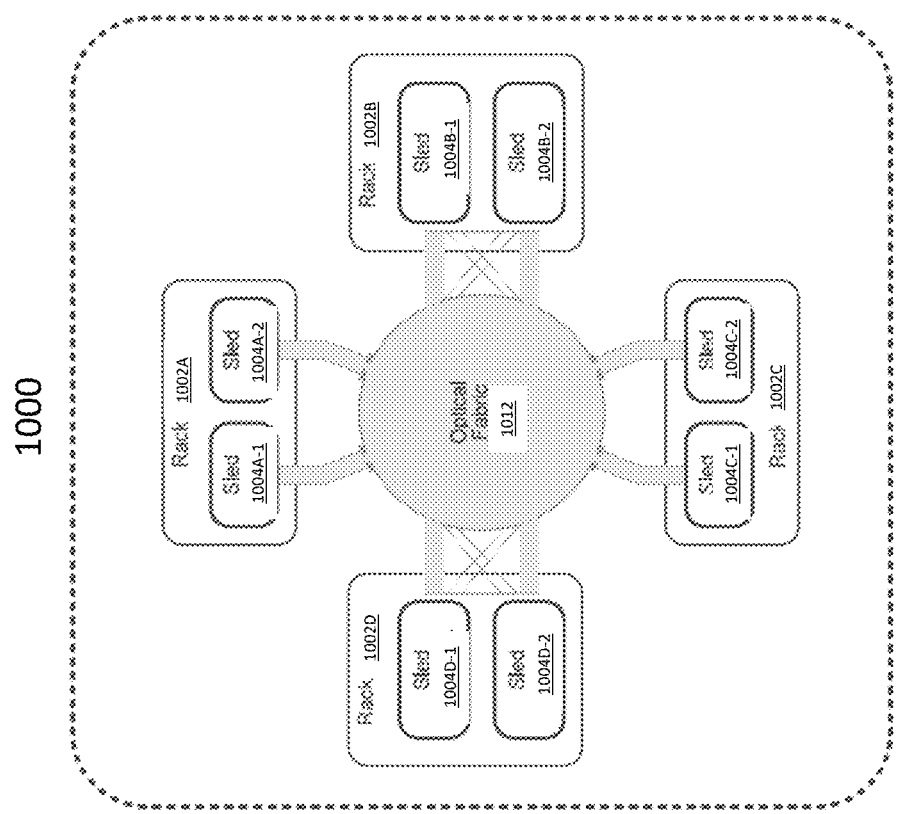

FIGS. 7a and 7b compare motherboard layout and wiring scheme between the prior art and improved riser card designs;

FIG. 8 shows a computing system;

FIG. 9 shows a networking system;

FIG. 10 shows a data center.

DETAILED DESCRIPTION

Figure 1:
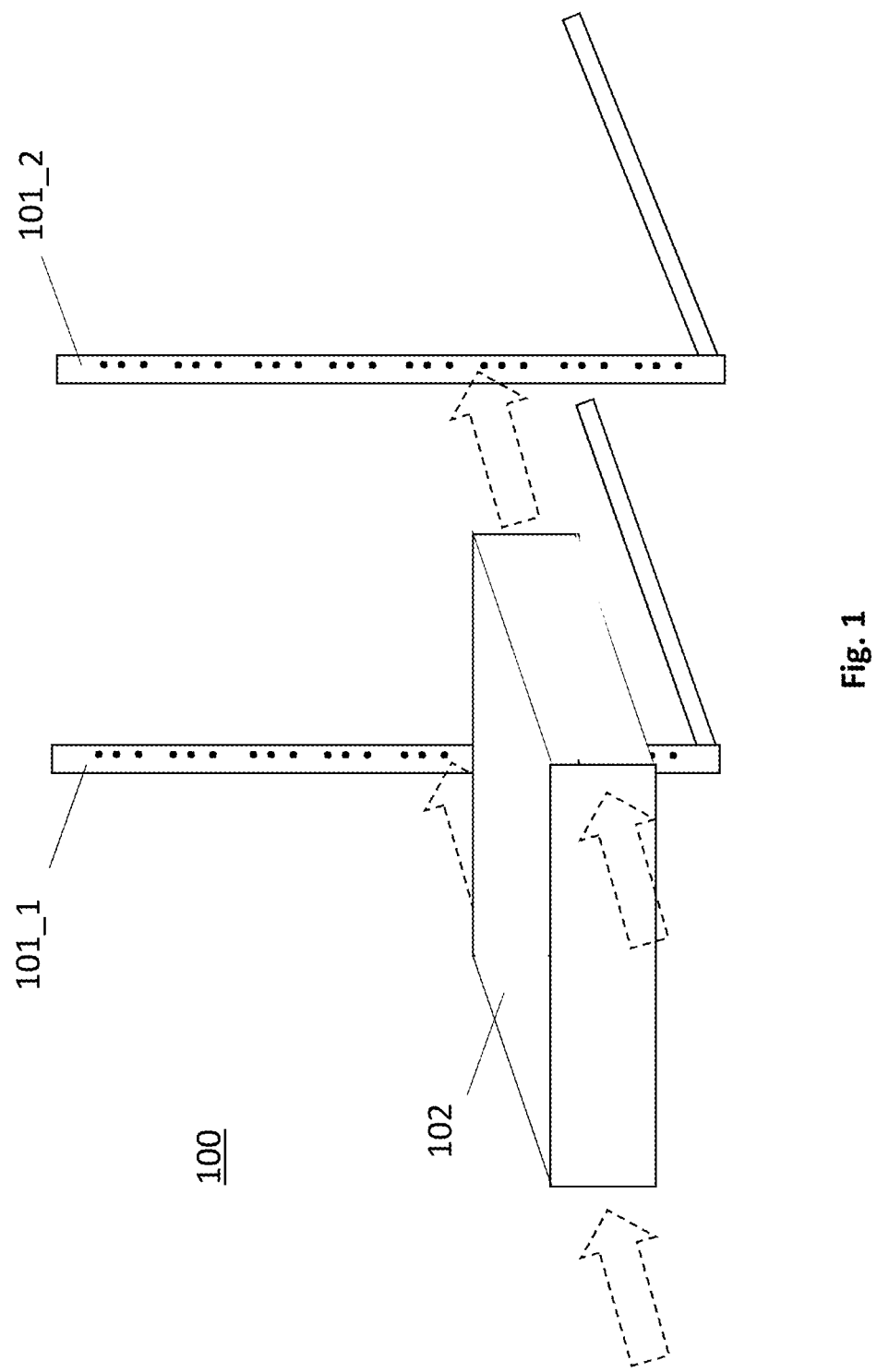
FIG. 1 shows a prior art rack.

FIG. 1 shows a high level view of a "rack" 100. A rack 100 is mechanical assembly for concentrating multiple computing system components and/or multiple computers (e.g., sled, blade or drawer computers) into a common frame. As observed in FIG. 1, the rack 100 includes a frame having a pair of metal strips 101_1, 101_2 with threaded holes. The strips are placed a distance apart (e.g., approximately 19 inches or 23 inches) with the threaded holes of a first strip being, ideally, vertically aligned with corresponding holes of a second strip. According to a particular layout, holes of a same strip are grouped in threes (a trio) with outer holes of a same trio being spaced 0.625 inches apart from a middle hole of the trio, and, neighboring outer holes of neighboring trios being spaced 0.5 inches apart.

The standardized separation between strips, the vertical alignment of corresponding holes of different strips and the standardized spacing of holes along same strips essentially defines a mechanical system into which various computer system components and/or entire computer systems can be physically mounted. Specifically, such a component/system (hereinafter, simply "component" 102) can, e.g., include flanges on its respective sides with through holes. The component 102 is mounted to the rack by feeding bolts/screws through their flange holes and into the threaded holes of the strips and tightening. Alternatively or combined, drawers or shelfs (not shown in FIG. 1) may be mounted to the rack and the component is 102 placed on the drawer/shelf.

Here, the width of any/all components that are mounted to the rack 100 cannot exceed the spacing between strips (but shorter, e.g., "half width" components that mount to only one strip exist). The various components that can be installed into a rack 100 can also have varying heights. According to current industry practice, a distance of 1U along a strip corresponds to 1.75". The heights of the various components that can plug into the rack 100 are usually specified in units of U (e.g., 1U, 2U, 3U, etc.).

As can be appreciated, suppliers of components strive to pack as much functionality as is practicable into a single rack mountable component 102.

Figure 2:
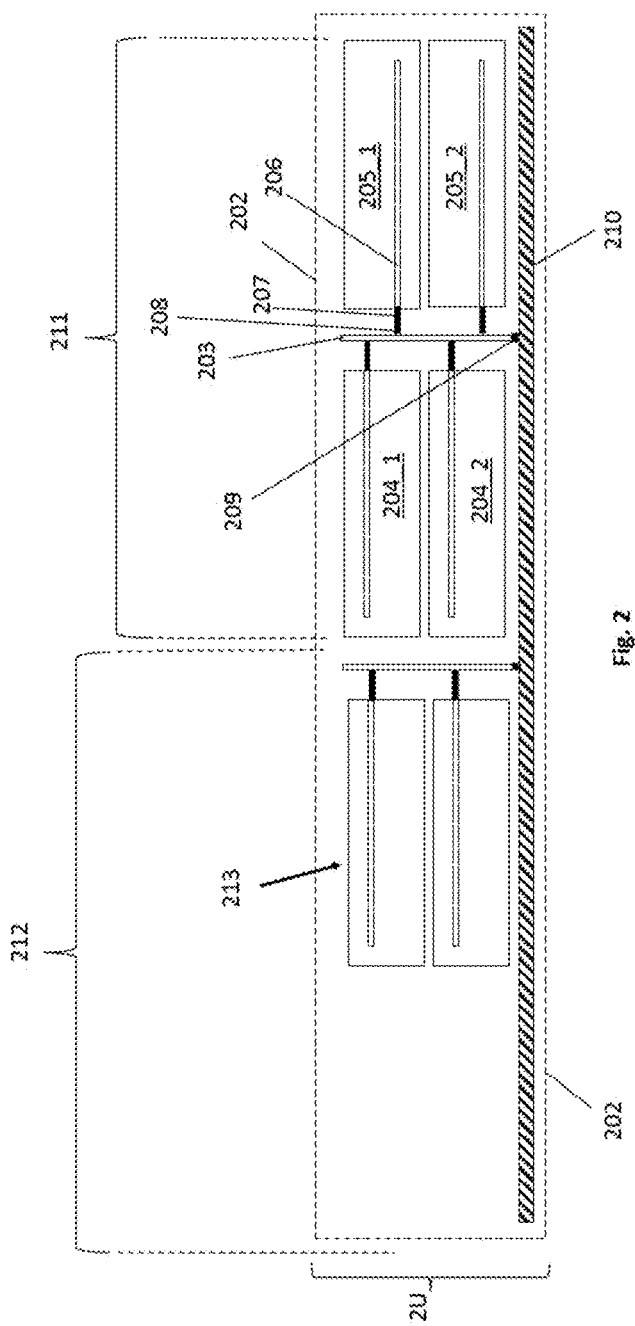
FIG. 2 shows a prior art rack mountable component with adaptor cards.

FIG. 2 shows a high level, front view, cross section of a current rack mountable component 202 that has a vertical height of 2U and includes a riser card 203 for receiving, on both of its sides, a "stack" of cards or modules 204, 205. Here, each card 204_1, 204_2, 205_1, 205_2 includes its own respective chassis. Inside each chassis is a PC board 206 having electrical components (e.g., semiconductor chips, etc.) for implementing the functionality of the adaptor card (for ease of drawing FIG. 2 only includes a numerical reference for the PC board 206 of card 205_1).

In the case of a networking communications card, electrical or optical cables connect to each card through the card's chassis for transmission/reception of signals to/from the PC board 206 and larger component chassis 202. A connector 207 emanates from the PC board 206 through the adaptor card's chassis for mating with the riser card 203.

The riser card 203 includes a corresponding connector 208 to mate with the card's connector 207. The riser card 203 includes electrical traces that run from the card's connector 207 to a "bottom side" connector 209 that mate to the component's motherboard 210 (which sits above the bottom cover of the component). The other cards 204_1, 204_2, 205_2 have a same/similar mechanical interface with the riser card 203 and electrical signaling relationship with the riser card 203 and motherboard 210. Each adaptor card approximately consumes a little less than 1U of vertical height. Therefore, a 2U component can only house a pair of stacked cards (one card stacked on top of the other).

Figure 3:
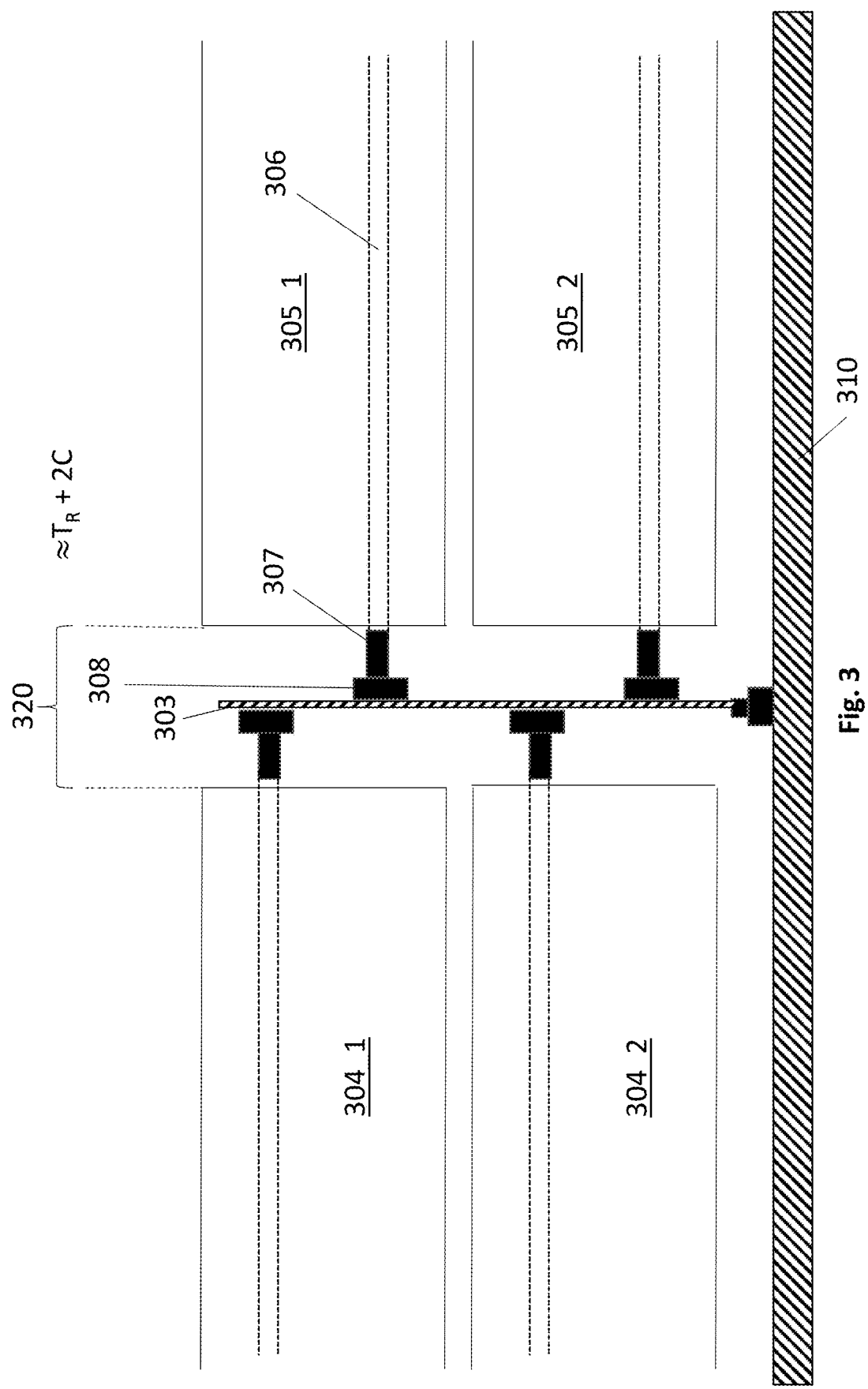
FIG. 3 shows a prior art riser card and adaptor card design.

FIG. 3 shows a "zoom in" view of the riser card 303 and its connections with the cards 304_1, 304_2, 305_1, 305_2 and mother board 310. As described above, each riser card/adaptor card connection mechanism includes a connector 308 that emanates perpendicular from the face of the riser card 303 and a connector 307 that emanates from the adaptor card's PC board 306 for mating with the corresponding riser card connector 308. Connectors emanate from both faces of the riser card 303 so that the single riser card 303 can mate with four different adaptor cards 304_1, 304_2, 305_1, 305_2 (two pairs of stacked cards on each side of the riser).

Notably, the riser card connectors 308 and the adaptor card connectors 307 consume "lateral space" on both sides of the riser card 303. In an existing system, referring back to FIG. 2, the total lateral space 211 that is consumed by the opposing pairs of adaptor cards 304, 305 that are plugged into the same riser card 203 is approximately 9" (8.9"). As such, if the width of opposing pairs of adaptor cards 211 is 9", then, two riser cards each with opposing sets of stacked adaptors cards would consume approximately 18" (17.8").

Recalling that current industry racks include strips that are spaced approximately 19" apart, the riser and adaptor card design of FIG. 3 is too wide to integrate eight total adaptor cards into the overall component. That is, referring to FIG. 2, if a second riser card with opposing pairs of adaptor cards was to be integrated into the component of FIG. 2, the second riser card with opposing sets of adaptor cards would consume additional lateral space 212 which would exceed the dimensions of the component chassis 202.

That is, the two riser cards each mounted on both sides with opposing adaptor cards (distance 211 plus distance 212) would consume 18" of a 19" component which does not leave enough headroom for the remaining, outer periphery construction of the overall component chassis 202. Said more simply, 18" of adaptor cards can not be fit into a 19" rack mount component chassis 202. Instead, only a single stacked pair 213 of adaptor cards can reside next to the fully populated riser card 203.

With component designers desiring to pack as much functionality as is practicable into a single rack-mountable component, it would enhance the competitiveness of the overall component if the lateral space consumption of opposing pairs of stacked adaptor cards could be reduced to less than 8" (approximately) so that two sets of opposing pairs of adaptor cards could laterally fit into a chassis that is to be mounted into a 19" rack.

A criticism concerning the layout efficiency of the approach of FIGS. 2 and 3 is that the full expanse of the connectors on the riser card and the connectors on the adapter cards contribute to the total width of the overall solution.

That is, if the lateral length of the connection between an adaptor card and the riser card is C, then, the distance between opposing cards is approximately $T_R+2C$ where $T_R$ is the thickness of the riser card. Said another way, the total lateral distance that is consumed by the connectors is the lateral length of the "left side" adaptor card and riser card connection, the thickness of the riser card and the length of the "right side" riser card and adaptor card connection.

Figure 4:
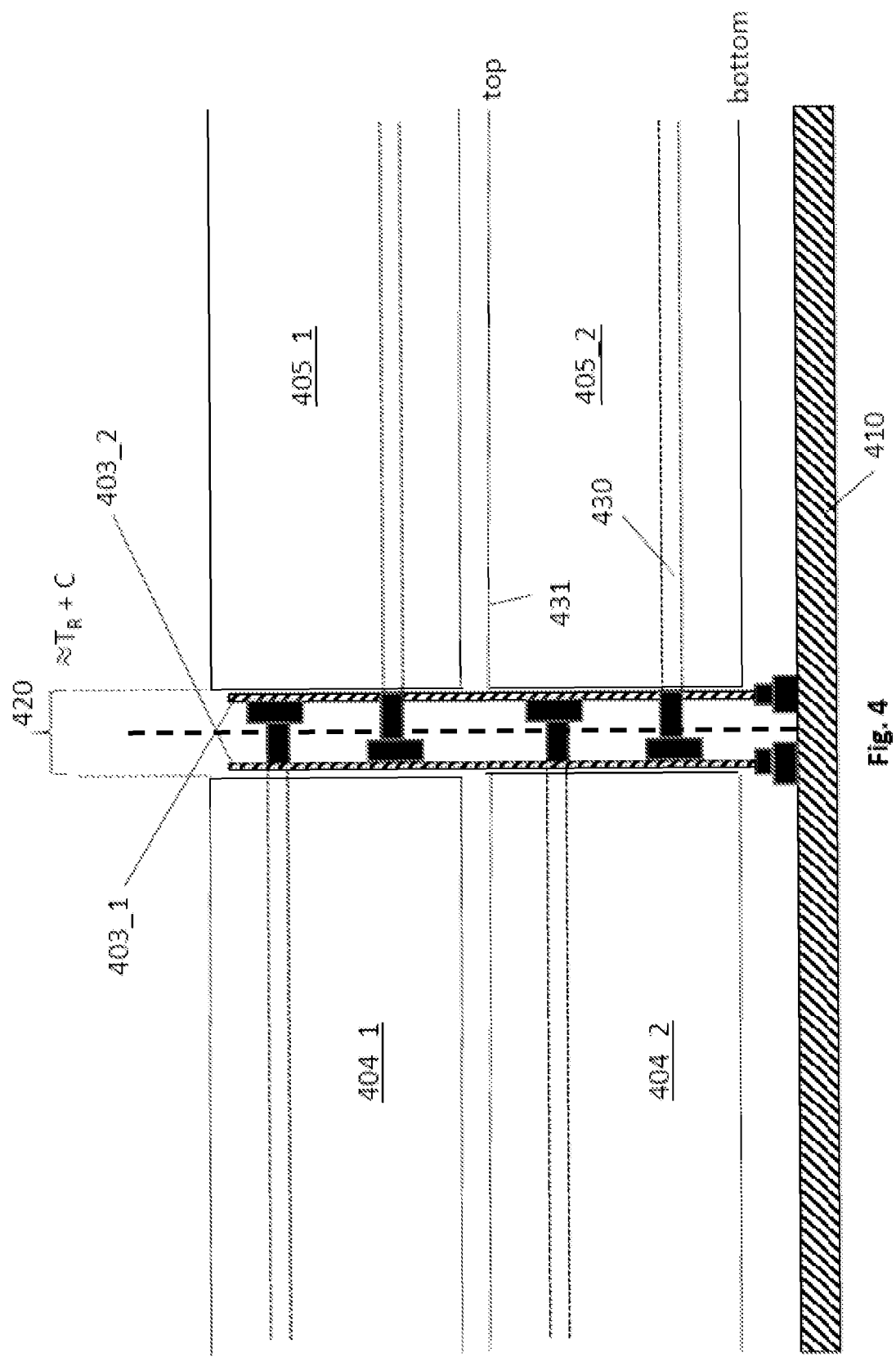
FIG. 4 shows an improved riser card and adaptor card design.

FIG. 4 show an improved design that introduces a second riser card to reduce the lateral space consumption 420 of the adapter/riser card connections associated with opposing adaptor cards 404, 405. In particular, the lateral space consumption 420 is reduced from $T_R+2C$ (as in FIG. 3) to approximately $T_R+C$. That is, the lateral space consumption 420 is reduced on the order of 50% (neglecting $T_R$ for ease of approximation). Here, the approximately 50% reduction in lateral space consumption is accomplished by laterally "collapsing" (or vertically "over-lapping") the left side and right side adaptor/riser card connection assemblies so that they are vertically aligned with one another.

In an embodiment, C is approximately 0.4" and $T_R$=0.1". Thus, whereas the lateral expanse 320 across the connection assembles for opposing cards in the approach of FIG. 3 is approximately 0.9" ($T_R+2C=(0.1")+(0.8")=0.9"$), by contrast, the lateral expanse 420 of the approach of FIG. 4 corresponds to approximately 0.5" ($T_R+C=(0.1")+(0.4")=0.5"$). Comparing FIGS. 2 and 5, this corresponds to a savings/reduction of 0.4" in the total lateral expanse of opposing adaptor cards 211, 511 from 8.9" to 8.5". With the total expanse of opposing adaptor cards 211, 511 being reduced from 8.9" to 8.5", a pair of opposing adaptor card sets 513 in the approach of FIG. 5 has a total lateral expanse of approximately 17.0" rather than 17.8" as with the approach of FIG. 2 (i.e., a savings of 0.8" is realized in pairs of opposing adaptor cards).

Figure 5:
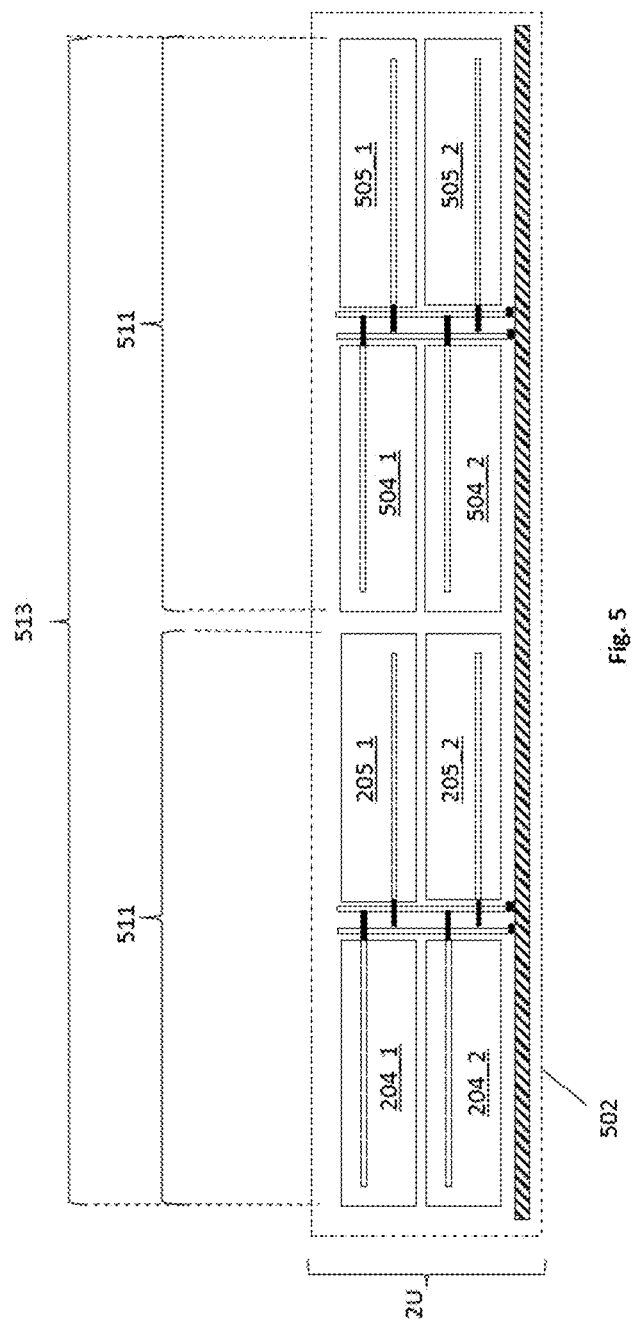
FIG. 5 shows an improved rack mountable component with adaptor cards.

Importantly, with a pair of opposing adaptor card sets now consuming 17.0" instead of 17.8", as observed in FIG. 5, two sets of opposing adaptor cards and their corresponding riser cards can be integrated into the component 502 with enough periphery headroom to enable the component to fit into a 19" rack.

Referring to FIG. 4, in order to effect such over-lap, the riser card face that mates to the left side adaptor cards 404 must be located along a different vertical plane than the riser card face that mates to the right side adaptor cards 405. That is, in order to effect the vertical over-lap of the riser/adaptor connections, the riser card face that mates to the left side adaptor cards 404_1, 404_2 must be located to the right of the riser card face that mates to the right side adaptor cards 405_1, 405_2. Correspondingly, the riser card face that mates to the right side adaptor cards 405_1, 405_2 must be located to the left of the riser card face that mates to the left side adaptor cards 404_1, 404_2.

In order to effect to two different planes of riser card faces, two different riser cards 403_1, 403_2 are needed. That is, as can be seen in FIG. 4, the left-side adaptor cards 404 plug into a right side riser card 403_1, and, the right side adaptor cards 405 plug into a left side riser card 403_2. Here, the right side riser card 403_1 sets the right sided connection plane needed for the left side adaptor cards 404, and the left side riser card 403_2 sets the left sided connection plane needed for the right side adaptor cards 405. With two different connection planes for the left and right side adaptor cards, the left side and right side adaptor card connection assemblies are able to vertically overlap.

Figure 6A:
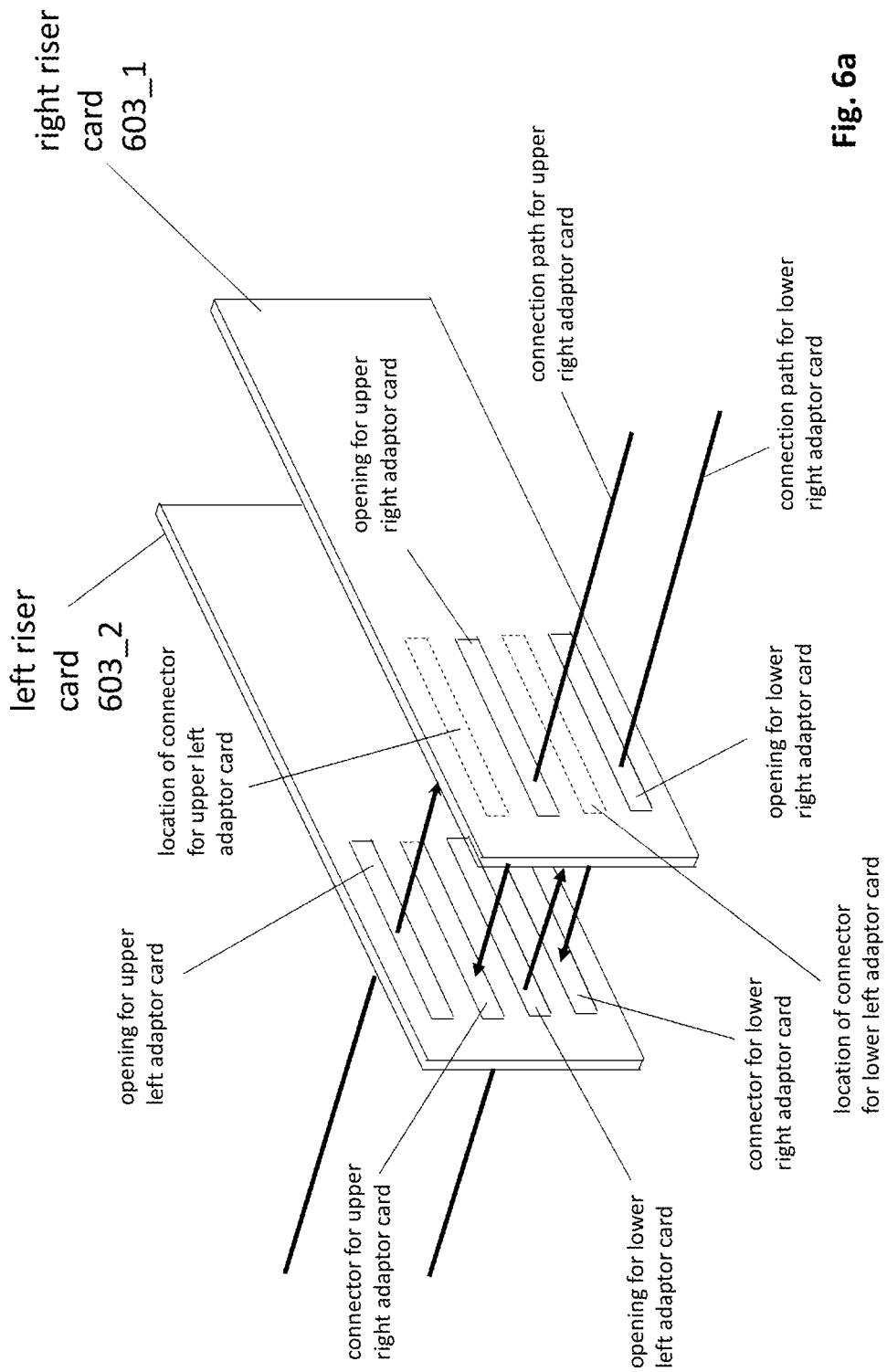
FIG. 6a shows how adaptor cards of the improved design interleave with riser cards.

Referring to FIG. 6a, note that both riser cards 603_1, 603_2 have openings in order to accommodate the other riser card's adaptor card connections. That is, the right side adaptor cards connect to the left riser card 603_2 through openings in the right riser card 603_1 in order to connect to the left riser card 603_2. Likewise, the left side adaptor cards connect to the right riser card 603_1 through openings in the left riser card 603_2 in order to connect to the right riser card 603_1.

In order to vertically align all of the riser/adaptor connection assemblies successfully (both left and right), no two connection assemblies can reside at a same vertical height above the motherboard. Thus, in various embodiments, all of the openings in both the left and right riser cards are located at their own unique vertical level. Said another way, no two adaptor/riser card connection assemblies or their respective riser card openings, whether on a same side or on opposing sides, reside at a same vertical level above the motherboard. By so doing, the corresponding connections of both the left side and right side adaptor cards to their respective riser cards are able to interleave along the vertical axis and achieve the desired vertical overlap of all such connections.

The unique vertical orientation of each card is achieved at least in part, according to one embodiment, by inverting one side of adaptor cards relative to the other side of adaptor cards. That is, referring back to FIG. 4, according to one embodiment, the "bottom" of an adaptor card is defined by the location of the card's PC board. That is, as can be seen in FIG. 4, with respect to lower right hand card 405_2, the PC board 430 of the adaptor card 405_2 is located in the lower half or "bottom" of the adaptor card 405_2. The vertical height of the adaptor card is therefore more defined by the components that are mounted to the top of the PC board 430 (e.g., semiconductor chips, relays, fuses, capacitors, heatsinks, etc.) which gives the adaptor its vertical profile. No component of the adaptor card extends beyond the upper plane 431 of the adaptor card's chassis which therefore establishes the "top" of the adaptor card.

Note that according to this adaptor card definition the right hand cards 405 sit "upright" while the left hand cards 404 sit "upside down". That is, with respect to the orientation of the right hand side adaptor cards 405, when they are plugged into their respective riser card 403_2, the bottoms of the adaptor cards 405 face the motherboard 410, while, the tops of the adaptor cards 405 are facing away from the motherboard 410. By contrast, with respect to the orientation of the left hand side adaptor cards 404, when they are plugged into their respective riser card 403_1, the bottoms of the adaptor cards 404 face away from the motherboard 410, while, the tops of the adaptor cards 404 face the motherboard 410.

Note that in alternative or combined embodiments the physical adaptor card design may be different than that depicted in FIG. 4. For example, according to one approach, the adaptor card's PC board has electrical components with substantial vertical profile(s) on both of its sides. As such, a substantial vertical profile extends from both sides of the PC board. In this case, the PC board and its connector for mating with the riser may be vertically aligned more in the "middle" of the full vertical profile of the adaptor card rather than being more aligned with the adaptor card's "bottom". In this case, as compared to their relative positions as observed in FIG. 4, the riser connectors for the right side up adaptor cards 405 may be moved upward while the riser connectors for the upside down adaptors 404 may be moved downward. Again, no two connectors should reside at a same vertical level so that the vertical overlap of all connectors is achieved.

Another ancillary improvement with the new approach of FIG. 4 is improved air cooling air efficiency. Here, currents of air flow through a component box are akin to currents of electricity in an electrical circuit in that, amongst multiple parallel paths, the currents with the largest magnitude will flow through the path(s) having the least resistance. With respect to the paths within a component box, larger openings (cross sectional areas) correspond to paths of lesser resistance while smaller openings correspond to paths of greater resistance.

Referring to the approach of FIG. 3, the various components that are mounted to an adaptor card (e.g., semiconductor chips, relays, fuses, capacitors, heatsinks, etc.) provide structure to the vertical profile above the adaptor card's PC board, which, in turn, corresponds to smaller openings for air flow. By contrast, the region around the riser card's connections, on both the left and right sides, are more open. As such, in the approach of FIG. 3, there will be less airflow over the heat generating components of the adaptor cards and more air flow over the connections between the adaptor cards and the riser card 403. This corresponds to thermal inefficiency because more air flow passes over components that generate little/no heat (connectors) while less air flow passes over components that generate substantial heat (the semiconductor chips of the adaptor card(s).

In the improved approach of FIG. 4, note that the vertical alignment of the connection assemblies of the left side cards 404 and right side cards 405 compacts the open space in the region of the riser connections as compared to the previous approach of FIG. 3. As such, the air flow resistance in the region of the riser connections is greater in the improved design of FIG. 4 as compared to the approach of FIG. 3. With increased relative resistance in this region, the resistance is more comparable to the resistances of the paths that flow over the components of the adaptor card(s). As such, comparatively less air will flow over the riser card connections and more air will flow over the adaptor's hear generating components in the approach of FIG. 4 as compared to the approach of FIG. 3.

Further still, recalling that the previous approach of FIG. 2 is only able to fit three adaptor cards across the width of a 19" rack mountable box while the improved approach of FIG. 5 is able to fit four cards across the width of a 19" rack mountable box, the previous approach of FIG. 2 possessed additional wide open spaces in the vicinity of the third stack of adaptor cards 213. As a consequence there was considerably more air flow around these cards 213 than the opposing pair of stacked adaptor cards 404, 405. By contrast, the improved approach of FIG. 4 effectively squeezes another adaptor card stack in the vicinity of the "third" adaptor card stack resulting in essentially same resistance for both sets of opposing cards and approximately equal air flow through them.

FIGS. 7a and 7b compare motherboard signal wiring and connector layout schemes for both the previous approach of FIG. 3 and the improved approach of FIG. 4. Here, as observed in FIG. 7a, which corresponds to the previous approach, all signal wires transported on the motherboard 700 that run to and/or from any of the four adaptor cards that are connected to the riser pass through the motherboard connector 743 to the riser. As such, leading edge or otherwise more expensive connector technologies were needed to transport so many signals through a single connector 743, and/or, more expensive motherboard layout schemes/technologies were needed (e.g., to minimize cross-talk which is more prevalent as wires become more densely packed).

By contrast, referring to FIG. 7b, which corresponds to the improved approach of FIG. 4 and FIG. 6a, both of the motherboard connectors 753_1, 753_2 that respectively connect to one of the pair of riser cards only needs to transport comparatively half of the signals. Thus, as observed in FIG. 7b, there is less wiring congestion in the vicinity of the motherboard connectors 753_1, 753_2 to the riser cards.

Figure 6B:
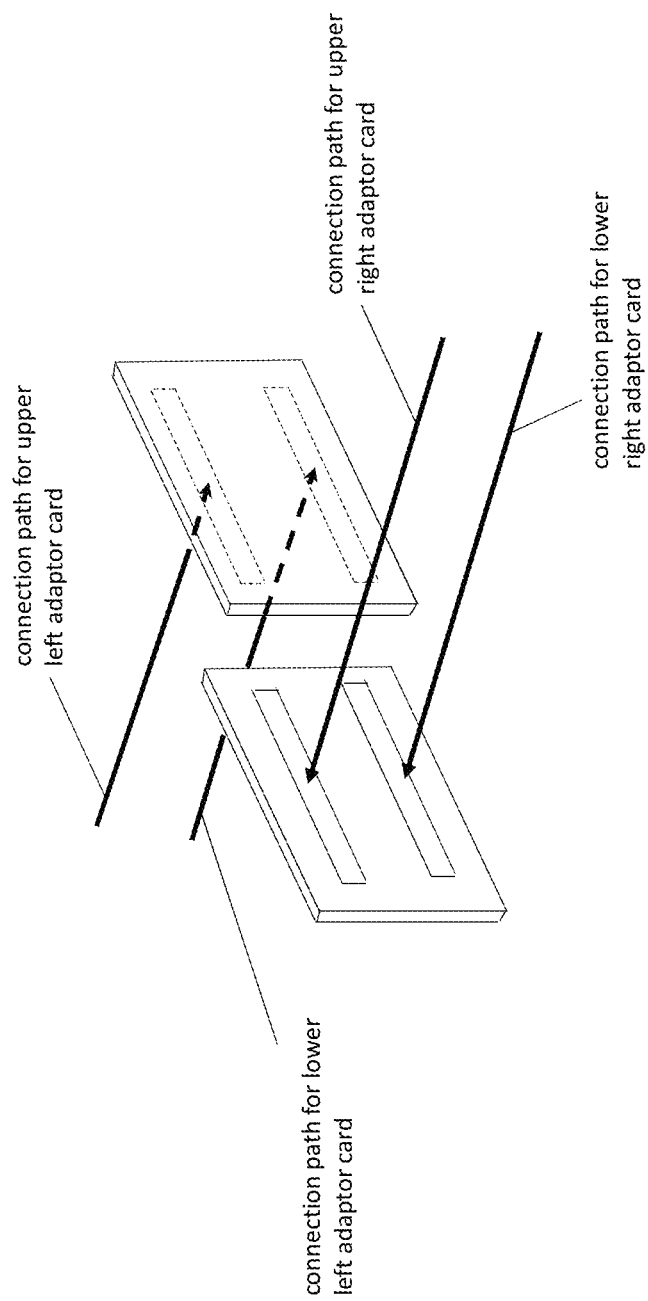
FIG. 6b shows another embodiment that does not include openings in the adaptor cards.

Although embodiments above have stressed riser card pairs that have openings to effect the vertical alignment of the respective cards' connectors, note that other embodiments need not necessarily include such openings and/or such vertical overlap. For example, referring to FIG. 6b, note that the same lateral compression of connector space is achieved in which neither riser includes an opening nor are connectors in strict vertical alignment. Rather, more generally, which is also true of the embodiments described above with respect to FIGS. 4 and 6a, the connections of the left and right cards to their respective riser cards pass through a same vertical plane that extends from the surface of the motherboard and runs parallel to the surfaces of the riser cards.

Although embodiments above have described two sets of opposing adaptor cards for a 17" rack mountable box, it should be apparent that other applications having different numbers of sets of opposing adaptor cards, adaptor cards of different dimensions, and/or a box of different dimensions than those described above can still make use of the teachings provided above.

For example, although only a pair of adaptor cards are stacked in the solutions described above, conceivably, a stack of more than two adaptor cards may be implemented (e.g., a stack of three cards for a 3U rack mountable component, a stack of four cards for a 4U rack mountable component, etc.). In this case, for example, the patterns of adaptor cards and their corresponding connections to their respective riser cards continues upward from the observed patterns of FIG. 4.

Also, although embodiments described above have been limited to networking adaptor cards that plug into a riser card, all other kinds of cards can be plugged into a riser such as storage (e.g., SATA, SCSI, etc.), co-processor (e.g., graphics, artificial intelligence, neural network, other specialized processor (e.g., digital signal processor)), memory (e.g., double data rate (DDR), high bandwidth memory (HBM)), etc., may all make use of the teachings provided above. Any/all such "cards" may also be referred to more generally as modules. Generally, such modules possess a connector for connecting to the riser and one or more semiconductor chips for performing some function.

In various embodiments, the interface between the cards that plug into the riser and the motherboard is some form of I/O interface (e.g., ISA, EISA, Micro Channel, PCI, PCIe, OpenCAPI, CXL, NVLink, etc.). That is, the "host" is represented by the motherboard and the host "connects" to the card through an, e.g., PCIe interface. As such, in this example, the riser card transports PCIe signal wiring between the motherboard and the card. The mechanical connections between the riser and the motherboard, and the riser and the cards, comply with a PCIe interface standard specification. Again other types of I/O interfaces besides PCIe can be implemented.

FIG. 8 provides an exemplary depiction of a computing system 800 such as a server or other higher performance computer within a data center. As observed in FIG. 8, the basic computing system 800 may include a central processing unit 801 (which may include, e.g., a plurality of general purpose processing cores 815_1 through 815_X) and a main memory controller 817 disposed on a multi-core processor or applications processor, system memory 802, a display 803 (e.g., touchscreen, flat-panel), a local wired point-to-point link (e.g., PCIe, USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_Y, one or more cameras 810, a battery 811, a power management control unit 812, a speaker and microphone 813 and an audio coder/decoder 814. The CPU 801 or other processor (e.g., GPU) or other high-performance semiconductor chip may include a heat sink assembly having a pre-loaded bolt as described herein and/or a carrier with anti-tile posts as described herein.

An applications processor or multi-core processor 850 can be an SOC that includes one or more general purpose processing cores 815 within its CPU 801, one or more graphical processing units 816, a memory management function 817 (e.g., a memory controller) and an I/O control function or peripheral controller 818. The general-purpose processing cores 815 typically execute the operating system and application software of the computing system. The graphics processing unit 816 typically executes graphics intensive functions to, e.g., generate graphics information that is presented on the display 803. The memory control function 817 interfaces with the system memory 802 to write/read data to/from system memory 802.

Each of the touchscreen display 803, the communication interfaces 804-807, the GPS interface 808, the sensors 809, the camera(s) 810, and the speaker/microphone codec 813, 814 all can be viewed as various forms of I/O (input and/or output) relative to the overall computing system including, where appropriate, an integrated peripheral device as well (e.g., the one or more cameras 810). Depending on implementation, various ones of these I/O components may be integrated on the applications processor/multi-core processor 850 or may be located off the die or outside the package of the applications processor/multi-core processor 850. The computing system also includes non-volatile storage 820 which may be the mass storage component of the system.

Here, most/all of the components discussed above with respect to FIG. 8 may be integrated into a same computing system rack mountable component. Alternatively, primarily certain ones of the components discussed above with respect to FIG. 8 (e.g., primarily the application processors, primarily the application processors and memory, primarily the memory, primarily GPUs, primarily non volatile storage, etc.) may be integrated into a computing system component rack mountable component.

Although embodiments above stressed integration of the riser card assembly into a computing system or computing system component, other embodiments can integrate the riser card assembly into a rack mountable networking system such as a rack mountable networking switch or router. FIG. 9 depicts a view of a networking switch or router. Switch/router core 904 can switch/route packets or frames of any format or in accordance with any specification from any port 902-0 to 902-X to any of ports 906-0 to 906-Y (or vice versa). Any of ports 902-0 to 902-X can be connected to a network of one or more interconnected devices. Similarly, any of ports 906-0 to 906-X can be connected to a network of one or more interconnected devices. Switch/router core 904 can decide which port to transfer packets or frames to using a table that maps packet characteristics with an associated output port. In addition, switch/router core 904 can perform packet replication for forwarding of a packet or frame to multiple ports and queuing of packets or frames prior to transfer to an output port. Here, the switch core may be integrated on a motherboard and the ports may be integrated on adaptor cards that are plugged into the riser card assembly described at length above.

Any of the rack mountable components referred to above may be mounted into a rack of a data center. FIG. 10 depicts a more detailed example of a data center. Various embodiments can be used in or with the data center of FIG. 10. As shown in FIG. 10, data center 1000 may include an optical fabric 1012. Optical fabric 1012 may generally include a combination of optical signaling media (such as optical cabling) and optical switching infrastructure via which any particular sled in data center 1000 can send signals to (and receive signals from) the other sleds in data center 1000. The signaling connectivity that optical fabric 1012 provides to any given sled may include connectivity both to other sleds in a same rack and sleds in other racks.

A rack mountable component may be implemented, e.g., as a "sled" having certain ones of the computing system components described above with respect to FIG. 10. For example, a first type of sled may be composed of CPU elements, a second type of sled may be composed of system memory elements, a third type of sled may be composed of peripheral I/O elements, a fourth type of card may be composed of mass storage elements, etc. Alternatively or in combination a fourth type of sled (a blade) may approximately correspond to a computing system (e.g., having CPU, system memory, peripheral I/O and mass storage elements or some combination thereof). For example, in various embodiments, each blade comprises a separate computing platform that is configured to perform server-type functions. Accordingly, each blade includes components common to conventional servers, including a main printed circuit board (main board/motherboard) providing internal wiring (i.e., buses) for coupling appropriate integrated circuits (ICs) and other components mounted to the board.

Data center 1000 includes four racks 1002A to 1002D and racks 1002A to 1002D house respective pairs of sleds 1004A-1 and 1004A-2, 1004B-1 and 1004B-2, 1004C-1 and 1004C-2, and 1004D-1 and 1004D-2. Thus, in this example, data center 1000 includes a total of eight sleds. Optical fabric 1012 can provide sled signaling connectivity with one or more of the seven other sleds. For example, via optical fabric 1012, sled 1004A-1 in rack 1002A may possess signaling connectivity with sled 1004A-2 in rack 1002A, as well as the six other sleds 1004B-1, 1004B-2, 1004C-1, 1004C-2, 1004D-1, and 1004D-2 that are distributed among the other racks 1002B, 1002C, and 1002D of data center 1000. The embodiments are not limited to this example. For example, fabric 1012 can provide optical and/or electrical signaling.

It is envisioned that aspects of the embodiments herein can be implemented in various types of computing and networking equipment, such as switches, routers and blade servers such as those employed in a data center and/or server farm environment. Typically, the servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities can typically employ large data centers with a multitude of servers.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." Some examples may be implemented using or as an article of manufacture or at least one computer-readable medium.

A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The invention claimed is:

1. An apparatus, comprising:
a motherboard comprising:
    a) a first riser card connector to connect to a first riser card;
    b) a second riser card connector to connect to a second riser card;
    b) a first set of signal wires coupled to the first riser card connector, the first set of signal wires to transport signals to and/or from a first card;
    c) a second set of signal wires coupled to the second riser card connector, the second set of signal wires to transport signals to and/or from a second card, the first and second riser card connectors positioned so that when the first card is connected to the first riser card and the second card is connected to the second riser card, the first card's connection to the first riser card and the second card's connection to the second riser card pass through a vertical plane that extends from the motherboard's surface, wherein, the first card's connection to the first riser card fits through an opening in the second riser card and the second card's connection to the second riser card fits through an opening in the first riser card.

2. The apparatus of claim 1 wherein the first and second riser card connectors run parallel to one another on the motherboard.

3. The apparatus of claim 2 wherein the first card is connected to the first riser card and the second card is connected to the second riser card.

4. The apparatus of claim 1 wherein the first card is connected to the first riser card and the second card is connected to the second riser card.

5. The apparatus of claim 1 wherein the first card's connector to the first riser card and the second card's connector to the second riser card face one another when the first card is connected to the first riser card and the second card is connected to the second riser card.

6. The apparatus of claim 1 wherein the motherboard is a 19" rack mountable component motherboard that can receive four cards along an axis that runs across the 19" opening of a 19" rack.

7. The apparatus of claim 6 wherein the 19" rack mountable component is a server computer.

8. The apparatus of claim 1 wherein at least one of the first set of signal wires and the second set of signal wires implement a PCIe interface.

9. An apparatus, comprising:
a) a first riser card connected to a first card;
b) a second riser card connected to a second card, wherein, the first card's connection to the first riser card and the second card's connection to the second riser card pass through a vertical plane that runs parallel to respective surfaces of the first and second riser cards, wherein:
i) the first riser card has a first opening;
ii) the second riser card has a second opening;
iii) the first card is connected to the first riser card through the second opening;
iv) the second card is connected to the second riser card through the first opening.

10. The apparatus of claim 9 further comprising:
a third card connected to the first riser card through another opening in the second riser card;
a fourth card connected to the second riser card through another opening in the first riser card.

11. The apparatus of claim 10 wherein the first and third cards are stacked and the second and fourth cards are stacked.

12. The apparatus of claim 9 wherein the first and second riser cards and the first and second cards are components of a rack mountable component.

13. The apparatus of claim 12 wherein the rack mountable component is a 19" rack mountable component.

14. The apparatus of claim 12 wherein the rack mountable component is a computing system or a component of a computing system.

15. The apparatus of claim 12 wherein the rack mountable component is a networking system.

16. The apparatus of claim 9 wherein the first and/or second cards are any of:
a networking adaptor card;
a co-processor card;
a memory card;
a storage card.

17. The apparatus of claim 9 wherein at least one of the first card's connection to the first riser card and the second card's connection to the second riser card corresponds to a PCIe interface.

18. An apparatus, comprising:
a riser card comprising:
a first connector to connect to a first card;
a second connector to connect to a second card;
a first opening through which a third card is to connect to a second riser card;
a second opening through which a fourth card is to connect to the second riser card.

* * * * *